US012578285B2

(12) United States Patent
Wang et al.

(10) Patent No.: US 12,578,285 B2
(45) Date of Patent: Mar. 17, 2026

(54) GAS FLOW CONFIGURATIONS FOR SEMICONDUCTOR INSPECTIONS

(71) Applicant: KLA Corporation, Milpitas, CA (US)

(72) Inventors: Chunhai Wang, Pleasanton, CA (US); Guoheng Zhao, Palo Alto, CA (US); Anatoly Romanovsky, Palo Alto, CA (US); Yihua Hao, San Jose, CA (US); Monica Ji, Miliptas, CA (US)

(73) Assignee: KLA Corporation, Milpitas, CA (US)

( * ) Notice: Subject to any disclaimer, the term of this patent is extended or adjusted under 35 U.S.C. 154(b) by 228 days.

(21) Appl. No.: 18/452,457

(22) Filed: Aug. 18, 2023

(65) Prior Publication Data

US 2024/0133825 A1      Apr. 25, 2024
US 2024/0230555 A9      Jul. 11, 2024

Related U.S. Application Data

(60) Provisional application No. 63/418,990, filed on Oct. 25, 2022.

(51) Int. Cl.
*G01N 21/95*          (2006.01)
*G01N 21/15*          (2006.01)
            (Continued)

(52) U.S. Cl.
CPC ......... *G01N 21/9501* (2013.01); *G01N 21/15* (2013.01); *G01N 21/88* (2013.01);
            (Continued)

(58) Field of Classification Search
CPC .... G01N 21/9501; G01N 21/15; G01N 21/88; G01N 21/95; G01N 21/956; G01N 2021/151; G01N 2201/0233; H01L 22/12
            (Continued)

(56) References Cited

U.S. PATENT DOCUMENTS 5,536,330 A      7/1996   Chen et al.
6,813,026 B2    11/2004   McAninch
            (Continued)

FOREIGN PATENT DOCUMENTS

KR      20-2000-0007677          5/2000
KR          20000007677  U   *   5/2000   ........... H01L 21/027
WO      2022-158471              7/2022

OTHER PUBLICATIONS

International Search Report for PCT/US2023/035258 mailed Feb. 8, 2024.

*Primary Examiner* — Michelle M Iacoletti
*Assistant Examiner* — Noah J. Haney
(74) *Attorney, Agent, or Firm* — Entropy Matters LLC

(57)          ABSTRACT

Methods and systems for inspecting a specimen are provided. One system includes an inspection subsystem configured for directing light to an area on the specimen and for generating output responsive to light from the area on the specimen. The system also includes a first gas flow subsystem configured for replacing a gas in a first local volume surrounding the area on the specimen with a first medium that scatters less of the light than the gas. In addition, the system includes a second gas flow subsystem configured for replacing the gas in a second local volume proximate the first local volume with a second medium different than the first medium. The system further includes a computer subsystem configured for detecting abnormalities on the specimen based on the output.

18 Claims, 4 Drawing Sheets

(51) Int. Cl.
    *G01N 21/88*          (2006.01)
    *G01N 21/956*      (2006.01)
    *H01L 21/66*        (2006.01)

(52) U.S. Cl.
    CPC ....... *G01N 21/95* (2013.01); *G01N 2021/151*
        (2013.01); *G01N 21/956* (2013.01); *G01N*
        *2201/0233* (2013.01); *H01L 22/12* (2013.01)

(58) Field of Classification Search
    USPC ...................................................... 356/237.5
    See application file for complete search history.

(56)            References Cited

U.S. PATENT DOCUMENTS

| | | | |
|---|---|---|---|
| 7,001,491 B2 | 2/2006 | Lombardi et al. | |
| 7,138,640 B1 * | 11/2006 | Delgado ............ | G02B 27/0006 |
| | | | 250/372 |
| 7,359,052 B2 | 4/2008 | Fielden et al. | |
| 7,372,559 B2 | 5/2008 | Haller et al. | |
| 7,420,681 B1 | 9/2008 | Wang et al. | |
| 7,564,552 B2 | 7/2009 | Fielden et al. | |
| 7,623,239 B2 | 11/2009 | Fielden et al. | |
| 7,755,764 B2 | 7/2010 | Kwak et al. | |
| 7,764,376 B2 | 7/2010 | Fielden et al. | |
| 8,817,250 B2 * | 8/2014 | Doyle ................ | H01L 21/6838 |
| | | | 356/237.5 |
| 9,662,688 B2 | 5/2017 | Rose et al. | |
| 10,153,215 B2 | 12/2018 | Woll | |
| 10,451,542 B2 * | 10/2019 | Doyle ...................... | G03F 1/84 |
| 11,315,816 B2 | 4/2022 | Pressburger et al. | |
| 2002/0088940 A1 | 7/2002 | Watanabe et al. | |
| 2004/0150820 A1 * | 8/2004 | Nikoonahad ...... | G01N 21/9501 |
| | | | 250/372 |
| 2007/0132987 A1 | 6/2007 | Haller et al. | |
| 2009/0059217 A1 * | 3/2009 | Okita ................... | G03F 7/7065 |
| | | | 356/237.5 |
| 2012/0144938 A1 * | 6/2012 | Inagaki ............ | H01L 21/67017 |
| | | | 73/865.8 |
| 2018/0181004 A1 * | 6/2018 | Saeed ............... | G01N 21/9515 |
| 2020/0403370 A1 | 12/2020 | Germanenko | |
| 2024/0079222 A1 * | 3/2024 | Terada ............. | H01J 37/32917 |

* cited by examiner

GAS FLOW CONFIGURATIONS FOR SEMICONDUCTOR INSPECTIONS

BACKGROUND OF THE INVENTION

1. Field of the Invention

This invention generally relates to inspection systems that include gas flow subsystems for reducing non-specimen induced light scatter and foreign material contamination of the specimen being inspected.

2. Description of the Related Art

The following description and examples are not admitted to be prior art by virtue of their inclusion in this section.

Fabricating semiconductor devices such as logic and memory devices typically includes processing a substrate such as a semiconductor wafer using a large number of semiconductor fabrication processes to form various features and multiple levels of the semiconductor devices. For example, lithography is a semiconductor fabrication process that involves transferring a pattern from a reticle to a resist arranged on a semiconductor wafer. Additional examples of semiconductor fabrication processes include, but are not limited to, chemical-mechanical polishing (CMP), etch, deposition, and ion implantation. Multiple semiconductor devices may be fabricated in an arrangement on a single semiconductor wafer and then separated into individual semiconductor devices.

Inspection processes are used at various steps during a semiconductor manufacturing process to detect defects on wafers and other substrates to promote higher yield in the manufacturing process and thus higher profits. Inspection has always been an important part of fabricating semiconductor devices such as ICs. However, as the dimensions of semiconductor devices decrease, inspection becomes even more important to the successful manufacture of acceptable semiconductor devices because smaller defects can cause the devices to fail.

Particles are killer defects in semiconductor manufacturing. 10 nm particles can break or short circuitry in devices with 20 nm critical dimension (CD). With the introduction of extreme ultraviolet (EUV) lithography, scaling of CDs continues slowly but steadily. The need to inspect even smaller particles is on the horizon.

A currently used method for detecting particles is to measure scattered light under dark field (DF) optics. Laser light is shined onto the wafer at an angle. Specular reflection may be discarded, and scattered light is collected through an objective. The scattered light includes that from particles, roughness of the wafer, and the air that the light beam passes through. To achieve required signal-to-noise ratio (SNR), scattered light from surface roughness and air must be suppressed. Air scattering is generally small and has not been an issue until the particle of interest shrinks to 10 nm and smaller. An effective way to reduce air scattering is to lower air density by drawing a vacuum between the objective and wafer. Some next generation particle inspection tools are expected to require about 10 Torr (about 1% atmosphere) of vacuum, from the specimen to about 1 mm above the specimen.

To create a vacuum, currently used methods and systems construct an enclosed chamber and draw vacuum in it. Inspection modules such as chuck, stages, and the objective will reside in the chamber or at least partially in it. Examples of currently used methods for creating such a vacuum environment for semiconductor applications are described in U.S. Pat. No. 5,536,330 to Chen et al. issued Jul. 16, 1996 and U.S. Pat. No. 7,001,491 to Lombardi et al. issued Feb. 21, 2006, which are incorporated by reference as if fully set forth herein.

The biggest problem with currently used vacuum configurations is the difficulty to maintain the cleanliness. For example, currently used semiconductor yield related tools that operate in a vacuum are typically 2 to 3 orders of magnitude dirtier than the cleanest particle inspection tools on the market today. Currently, surface inspection tools achieve superior cleanliness using purging air, which showers around the wafer and effectively pushes out all particles that would fall on the wafer. In the case of currently used vacuum configurations, it would be impossible to implement air purging since the whole wafer is in vacuum. Another issue is the cost with currently used vacuum configurations. Vacuum will dramatically drive up the size of the tool and the cost of the stage, chuck, and the objective. Throughput will be hit hard due to the extra time needed to draw the vacuum each time a new wafer is loaded. It may be less of an issue for relatively low throughput tools like electron beam inspectors and defect review tools but would be a big issue for higher throughput ones like particle inspection tools since their throughputs are usually in the neighborhood of 10 to 100 wafers per hour.

Accordingly, it would be advantageous to develop systems and/or methods for inspecting a specimen with reduced non-defect and/or particle light scattering and foreign material contamination that do not have one or more of the disadvantages described above.

SUMMARY OF THE INVENTION

The following description of various embodiments is not to be construed in any way as limiting the subject matter of the appended claims.

One embodiment relates to a system configured for inspecting a specimen. The system includes an inspection subsystem configured for directing light to an area on the specimen and for generating output responsive to light from the area on the specimen. The system also includes a first gas flow subsystem configured for replacing a gas in a first local volume surrounding the area on the specimen with a first medium that scatters less of the light than the gas. In addition, the system includes a second gas flow subsystem configured for replacing the gas in a second local volume proximate the first local volume with a second medium different than the first medium. The system further includes a computer subsystem configured for detecting abnormalities on the specimen based on the output. The system may be further configured as described herein.

Another embodiment relates to a method for inspecting a specimen. The method includes directing light to an area on a specimen and generating output responsive to light from the area on the specimen. The method also includes replacing a gas in a first local volume surrounding the area on the specimen with a first medium during the directing and the generating. The first medium scatters less of the light than the gas. In addition, the method includes replacing the gas in a second local volume located proximate to the first local area with a second medium during the directing and the generating. The second medium is different than the first medium. The method further includes detecting abnormalities on the specimen based on the output. The detecting is performed by a computer system.

The steps of the method may be performed as described further herein. The method may include any other step(s) of any other method(s) described herein. The method may be performed by any of the systems described herein.

An additional embodiment relates to a non-transitory computer-readable medium storing program instructions executable on a computer system for performing a computer-implemented method for inspecting a specimen. The computer-implemented method includes the steps of the method described above. The computer-readable medium may be further configured as described herein. The steps of the computer-implemented method may be performed as described further herein. In addition, the computer-implemented method for which the program instructions are executable may include any other step(s) of any other method(s) described herein.

BRIEF DESCRIPTION OF THE DRAWINGS

Other objects and advantages of the invention will become apparent upon reading the following detailed description and upon reference to the accompanying drawings in which.

Figure 1:
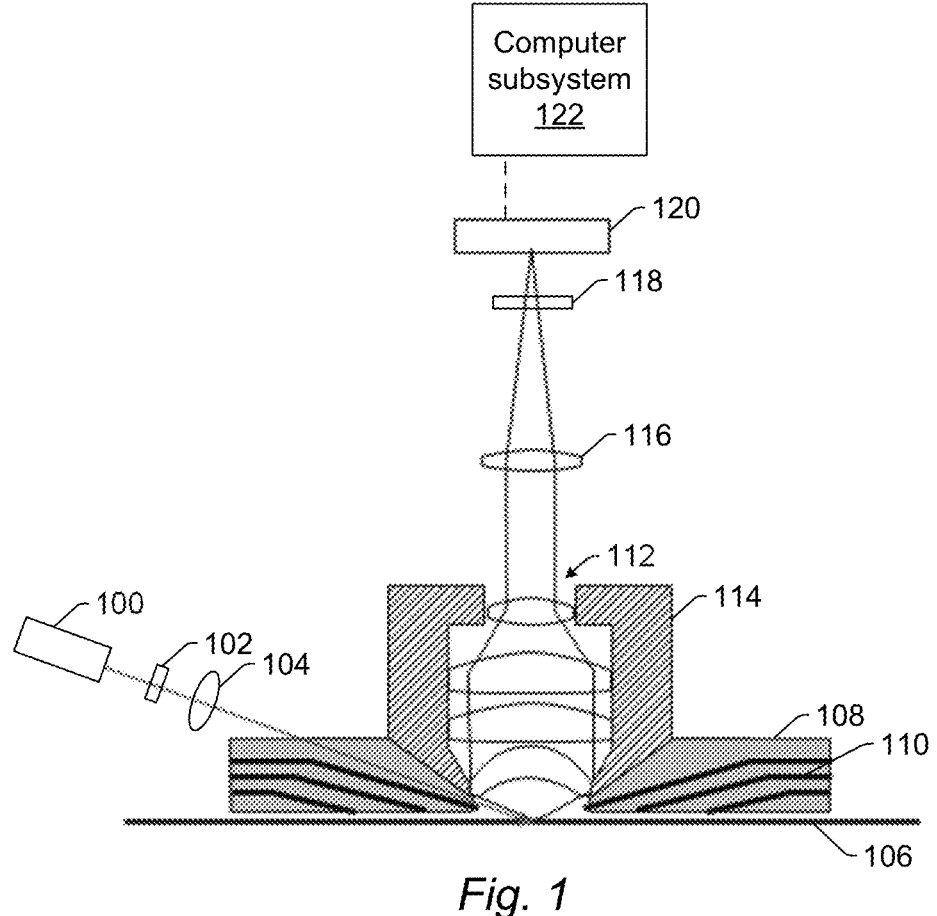
FIG. 1 is a schematic diagram illustrating a side view of an embodiment of a system configured for inspecting a specimen.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

Turning now to the drawings, it is noted that the figures are not drawn to scale. In particular, the scale of some of the elements of the figures is greatly exaggerated to emphasize characteristics of the elements. It is also noted that the figures are not drawn to the same scale. Elements shown in more than one figure that may be similarly configured have been indicated using the same reference numerals. Unless otherwise noted herein, any of the elements described and shown may include any suitable commercially available elements.

The embodiments described herein generally relate to systems and methods for inspecting a specimen. For example, the embodiments described herein provide methods and systems for using two different media (e.g., applying purging air and either creating a local vacuum or applying a helium medium) for particle inspection equipment. To make the next generation of particle inspection tools, the tools must have a means to reduce air scattering (e.g., via vacuum or another medium that scatters less light than air) and a means to keep the tool clean (e.g., via purging air). The two requirements seem contradictory, but the inventors have created system architectures described herein that make meeting both requirements possible. The embodiments described herein have a number of advantages and improvements over currently available inspection tools. For example, the embodiments allow a substantially small volume of vacuum to be created between a specimen and an objective which eliminates the over head time of pumping down a large vacuum chamber. The embodiments also allow clean air purged around the specimen to keep it clean.

Although the embodiments described herein may be particularly useful for wafer inspectors designed for particle inspection, the embodiments may be useful for other wafer inspectors, other types of specimen inspectors, metrology tools, optical defect review tools, and the like.

In one embodiment, the specimen is a wafer. The wafer may include any wafer known in the semiconductor arts. Although some embodiments may be described herein with respect to a wafer or wafers, the embodiments are not limited in the specimen for which they can be used. For example, the embodiments described herein may be used for specimens such as reticles, flat panels, personal computer (PC) boards, and other semiconductor specimens.

One system configured for inspecting a specimen includes an inspection subsystem configured for directing light to an area on the specimen and for generating output responsive to light from the area on the specimen. The inspection subsystem includes at least an illumination subsystem that includes a light source configured to generate light that is directed to an area on a specimen and a detection subsystem that includes a detector configured to detect light from the specimen and to generate output responsive to the detected light. One embodiment of such a system is shown in FIG. 1.

As shown in FIG. 1, the illumination subsystem includes light source 100. The illumination subsystem is configured to direct light generated by the light source to the area (not shown) on the specimen at one or more angles of incidence, which may include one or more oblique angles and/or one or more normal angles. The area may be a relatively large spot, one or more spots, a field, a line, etc. For example, as shown in FIG. 1, light from light source 100 is directed through optical element 102 and then lens 104 to specimen 106 at an oblique angle of incidence. The angle of incidence may include any suitable angle of incidence, which may vary depending on, for instance, characteristics of the specimen and the process to be performed on the specimen.

The illumination subsystem may be configured to direct the light to the specimen at different angles of incidence at different times. For example, the inspection subsystem may be configured to alter one or more characteristics of one or more elements of the illumination subsystem such that the light can be directed to the specimen at an angle of incidence that is different than that shown in FIG. 1. In one such example, the inspection subsystem may be configured to move light source 100, optical element 102, and lens 104 such that the light is directed to the specimen at a different angle of incidence.

In some instances, the inspection subsystem may be configured to direct light to the specimen at more than one angle of incidence at the same time. For example, the illumination subsystem may include more than one illumination channel, one of the illumination channels may include light source 100, optical element 102, and lens 104 as shown in FIG. 1 and another of the illumination channels (not shown) may include similar elements, which may be configured differently or the same, or may include at least a light source and possibly one or more other components such as those described further herein. If such light is directed to the specimen at the same time as the other light, one or more characteristics (e.g., wavelength, polarization, etc.) of the light directed to the specimen at different angles of incidence may be different such that light resulting from illumination of the specimen at the different angles of incidence can be discriminated from each other at the detector(s).

In another instance, the illumination subsystem may include only one light source (e.g., source 100 shown in FIG. 1) and light from the light source may be separated into different optical paths (e.g., based on wavelength, polarization, etc.) by one or more optical elements (not shown) of the illumination subsystem. Light in each of the different optical paths may then be directed to the specimen. Multiple illumination channels may be configured to direct light to the specimen at the same time or at different times (e.g., when different illumination channels are used to sequentially illuminate the specimen). In another instance, the same illumination channel may be configured to direct light to the specimen with different characteristics at different times. For example, optical element 102 may be configured as a spectral filter and the properties of the spectral filter can be changed in a variety of different ways (e.g., by swapping out the spectral filter) such that different wavelengths of light can be directed to the specimen at different times. The illumination subsystem may have any other suitable configuration known in the art for directing light having different or the same characteristics to the specimen at different or the same angles of incidence sequentially or simultaneously.

Light source 100 may include any suitable light source such as any suitable laser known in the art configured to generate light at any suitable wavelength(s) known in the art. The laser may be configured to generate light that is monochromatic or nearly-monochromatic. In addition, the laser may be a mode-locked laser. The light source may also include a polychromatic light source that generates light at multiple discrete wavelengths or wavebands.

Light from optical element 102 may be focused to specimen 106 by lens 104. Although lens 104 is shown in FIG. 1 as a single refractive optical element, in practice, lens 104 may include a number of refractive and/or reflective optical elements that in combination focus the light from the optical element to the specimen. The illumination subsystem shown in FIG. 1 and described herein may include any other suitable optical elements (not shown). Examples of such optical elements include, but are not limited to, polarizing component(s), spectral filter(s), spatial filter(s), reflective optical element(s), apodizer(s), beam splitter(s), aperture(s), and the like, which may include any such suitable optical elements known in the art. In addition, the system may be configured to alter one or more of the elements of the illumination subsystem based on the type of illumination to be used. Furthermore, the illumination subsystem may be configured to direct the light to only one area on the specimen or more than one area on the specimen. The area(s) may have any suitable characteristics known in the art.

The inspection subsystem may also include a scanning subsystem configured to cause the light to be scanned over the specimen. For example, the inspection subsystem may include a stage (not shown in FIG. 1) on which specimen 106 is disposed. The scanning subsystem may include any suitable mechanical and/or robotic assembly (that includes the stage) that can be configured to move the specimen such that the light can be scanned over the specimen. In addition, or alternatively, the inspection subsystem may be configured such that one or more optical elements of the inspection subsystem perform some scanning of the light over the specimen. The light may be scanned over the specimen in any suitable fashion. The stage may be further configured as described herein.

The detection subsystem may include one or more detection channels. At least one of the detection channel(s) includes a detector configured to detect light from the specimen due to illumination of the specimen by the illumination subsystem and to generate output responsive to the detected light. For example, the detection subsystem shown in FIG. 1 includes a detection channel formed by objective 112, tube lens 116, element 118, and detector 120. As shown in FIG. 1, the detection channel is configured to detect scattered light from the specimen. In this manner, the detection channel may be configured for dark field (DF) imaging.

The detection subsystem may also include more than one detection channel (not shown) that collect and detect light at different angles of collection. In some instances, one detection channel is configured to detect specularly reflected light, and the other detection channel is configured to detect light that is not specularly reflected (e.g., scattered, diffracted, etc.) from the specimen. However, two or more of the detection channels may be configured to detect the same type of light from the specimen (e.g., scattered light). Although the objective lens and the tube lens are shown in FIG. 1 as including particular numbers of refractive optical elements having particular shapes, the objective and tubes lenses may each include one or more refractive optical element(s) and/or one or more reflective optical element(s) having any suitable configuration known in the art.

The one or more detection channels may include any suitable detectors known in the art such as photo-multiplier tubes (PMTs), charge coupled devices (CCDs), and time delay integration (TDI) cameras. The detectors may also include non-imaging detectors or imaging detectors. If the detectors are non-imaging detectors, each of the detectors may be configured to detect certain characteristics of the light such as intensity but may not be configured to detect such characteristics as a function of position within the imaging plane. As such, the output that is generated by each of the detectors included in each of the detection channels may be signals or data, but not image signals or image data. In such instances, a computer subsystem such as computer subsystem 122 of the system may be configured to generate images of the specimen from the non-imaging output of the detectors. However, in other instances, the detectors may be configured as imaging detectors that are configured to generate imaging signals or image data. Therefore, the system may be configured to generate output and/or images described herein in a number of ways.

The inspection subsystem may be configured for generating output, e.g., images, of the specimen with multiple modes. In general, a "mode" is defined by the values of parameters of the inspection subsystem used for generating output for a specimen. Therefore, modes may be different in the values for at least one of the parameters of the illumination and detection subsystems (other than position on the specimen at which the output is generated). For example, different modes may use different wavelength(s) of light for illumination. The modes may be different in the illumination wavelength(s) as described further herein (e.g., by using different light sources, different spectral filters, etc. for different modes). In another example, different modes may use different illumination channels of the illumination subsystem. For example, as noted above, the illumination subsystem may include more than one illumination channel. As such, different illumination channels may be used for different modes. The modes may also or alternatively be different in one or more collection/detection parameters of the detection subsystem. The modes may be different in any one or more alterable parameters (e.g., illumination polarization(s), angle(s), wavelength(s), etc., detection polarization(s), angle(s), wavelength(s), etc.) of the system. The inspection subsystem may scan the specimen with the different modes in the same scan or different scans, e.g., depending on the capability of using multiple modes to scan the specimen at the same time.

FIG. 1 is provided herein to generally illustrate a configuration of an inspection subsystem that may be included in the system embodiments described herein. Obviously, the inspection subsystem configuration described herein may be altered to optimize the performance of the system as is normally performed when designing a commercial system. In addition, the systems described herein may be implemented using an existing inspection system (e.g., by adding functionality described herein to an existing optical system) such as the SPx series of tools that are commercially available from KLA Corp., Milpitas, Calif., which may be capable of detecting substantially small particles down to about 10 nm. For some such systems, the methods described herein may be provided as optional functionality of the system (e.g., in addition to other functionality of the system). Alternatively, the system described herein may be designed "from scratch" to provide a completely new system.

The system further includes a computer subsystem configured for detecting abnormalities on the specimen based on the output. For example, the system may include computer subsystem 122 coupled to detector 120 in any suitable manner (e.g., via one or more transmission media, which may include "wired" and/or "wireless" transmission media) such that the computer subsystem can receive the output, images, etc. generated by the detector during scanning of the specimen. The computer subsystem may be configured for detecting abnormalities on the specimen by applying a defect detection method to the output generated by the detector. Detecting abnormalities on the specimen may be performed in any suitable manner known in the art (e.g., applying a defect detection threshold to the output and determining that any output having a value above the threshold corresponds to an abnormality or a potential abnormality) with any suitable defect detection method and/or algorithm. Computer subsystem 122 may be configured to perform any other functions described further herein. This computer subsystem may be further configured as described herein.

The term "abnormalities" as used herein is generally defined as instances of specimen characteristics that are different than intended or expected. Examples of abnormalities that may be detected by the embodiments described herein include the presence of particles on the specimen (e.g., fall on particles, foreign material, etc.), defects (e.g., defects in one or more materials, patterned or unpatterned, formed on the specimen), etc. In general, the embodiments described herein may be configured for detecting different kinds of abnormalities depending on the abnormalities of interest and the specimen characteristics (e.g., type, layer, etc.). In other words, the embodiments described herein are not limited in the types of abnormalities that they can be configured for detecting.

This computer subsystem (as well as other computer subsystems described herein) may also be referred to herein as computer system(s). Each of the computer subsystem(s) or system(s) described herein may take various forms, including a personal computer system, image computer, mainframe computer system, workstation, network appliance, Internet appliance, or other device. In general, the term "computer system" may be broadly defined to encompass any device having one or more processors, which executes instructions from a memory medium. The computer subsystem(s) or system(s) may also include any suitable processor known in the art such as a parallel processor. In addition, the computer subsystem(s) or system(s) may include a computer platform with high speed processing and software, either as a standalone or a networked tool.

As described herein, the system is configured as an inspection system. In another embodiment, the system may be configured as a metrology or defect review system. In particular, the embodiment of the system shown in FIG. 1 may be modified in one or more parameters to provide different imaging capability depending on the application for which it will be used. In one such example, the optical subsystem shown in FIG. 1 may be configured to have a higher resolution if it is to be used for metrology or defect review rather than for inspection. In other words, the embodiments of the inspection subsystem shown in FIG. 1 describe some general and various configurations for an optical subsystem that can be tailored in a number of manners that will be obvious to one skilled in the art to produce systems having different imaging capabilities that are more or less suitable for different applications.

The system includes a first gas flow subsystem configured for replacing a gas in a first local volume surrounding the area on the specimen with a first medium that scatters less of the light than the gas. The first local volume may have a height defined by the space between an objective (e.g., objective 112 shown in FIG. 1) of the inspection subsystem and the upper surface of the specimen. The first local volume may be substantially centered on the area (or areas) illuminated on the specimen, but it does not need to be exactly centered on the area (or areas). The first local volume preferably surrounds the area to the extent that any light from the specimen that is collected by the inspection subsystem travels from specimen to the objective entirely within the first medium. The width of the first local volume may therefore depend on the collection angles (the angles at which the light is collected from the specimen by the objective). The width of the first local volume may also be configured so that the light from the illumination subsystem is directed through the first medium to the area (or areas) on the specimen. Therefore, the dimensions of the first local volume may vary depending on the configuration of the inspection subsystem and how closely the specimen is positioned to the objective.

In one embodiment, the first medium is a vacuum. For example, vacuum may be drawn by pumping air out of the first local volume through one or more pumping channels. In general, as shown in FIG. 1, the first gas flow subsystem includes housing block 108 having multiple channels 110 formed therein through which the first gas flow subsystem can replace a gas in the first local volume surrounding the area illuminated on the specimen by the inspection subsystem with a first medium that scatters less of the light than the gas. Housing block 108 may be separate from objective housing 114 shown in FIG. 1, but both of these elements, multiple channels 110, and the first gas flow subsystem may be further configured as described herein. The system embodiment shown in FIG. 1 may also be further configured as described herein with additional elements not shown in FIG. 1 only for the sake of clarity.

Figure 2:
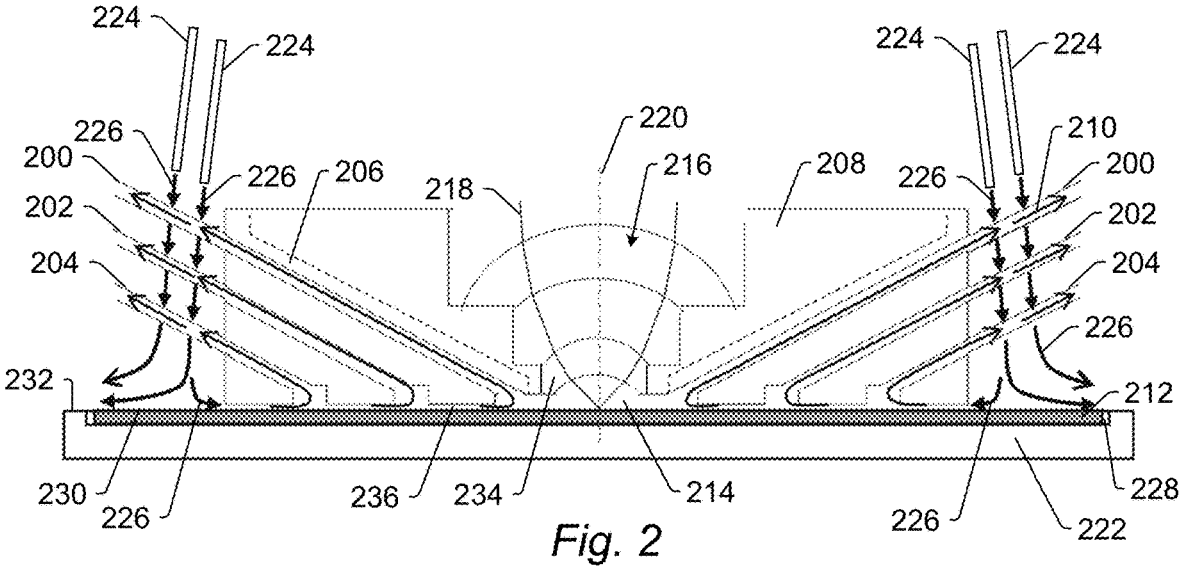
FIGS. 2-6 are schematic diagrams illustrating cross-sectional views of various embodiments of portions of a system configured for inspecting a specimen and for using different media for reducing light scattering and foreign material introduction during the inspection.

FIG. 2 illustrates further detail of the first gas flow subsystem that is shown in FIG. 1 configured for creating a local vacuum between an objective and a specimen. In particular, the first gas flow subsystem may include multiple channels 200, 202, and 204 formed in housing block 206. The vacuum channels may be drilled into housing block 206, which may be formed of any suitable material such as stainless steel. Housing block 206 may be a separate assembly attached to the objective housing. In this manner, the air channels can be machined in a separate assembly attached to the objective assembly. Housing block 206 may be coupled to objective housing 208 (e.g., via screws, adhesive, etc.), so that the two housings are adjacent to each other and abutting each other as shown by the dashed line between the housings in FIG. 2. In this case, the dashed lines between housing block 206 and objective housing 208 can serve as a boundary between the objective housing and the air channel housing. However, housing block 206 and objective housing 208 may be formed from a single piece of material and may therefore be a single element in the system. For example, the air channels can be machined as an integrated part of the objective assembly. In general, as long as housing block 206 and objective housing 208 can be configured to allow no air flow between the housings, the housing block and the objective housing can be fabricated in a variety of ways depending on, for example, the material requirements of the housings, the complexity of fabricating both from a single piece of material, the difficulty of coupling separate housings to eliminate air flow between the housings, etc.

As further shown in FIG. 2, the multiple channels are configured so that air 210 can be drawn through the channels away from specimen 212 and out of volume 214 between objective 216 and the specimen thereby forming a vacuum between the objective and the specimen. For example, each of the multiple channels may be coupled to a vacuum pump (not shown in FIG. 2) that draws air through the channels in this manner. The vacuum pumps may be any suitable vacuum pumps known in the art and may be selected based on information about the volume between the specimen and the objective, the required or desired level of vacuum, the configuration of the channels, etc. The first gas flow subsystem may include any other suitable elements (not shown) normally included in vacuum systems such as valves, exhaust elements, controllers, etc. The vacuum created in the local volume between the objective and the wafer may be about 10 Torr or any other suitable value depending on the requirements of the inspection system in which the first gas flow subsystem is included.

Objective 216 may be further configured as described herein, and the optical element of objective 216 shown in FIG. 2 may be only one of multiple optical elements of the objective as shown in FIG. 1. For example, the optical element of objective 216 shown in FIG. 2 may be the element of objective 112 shown in FIG. 1 closest to the specimen. Alternatively, objective 216 may include only the one optical element shown in FIG. 2. As described further herein, light 218 scattered from the area illuminated on the specimen may be collected by the objective and directed to one or more other elements of the inspection subsystem. Vertical line 220 indicates the optical axis of the collection/detection subsystem of the inspection subsystem.

Figure 3:
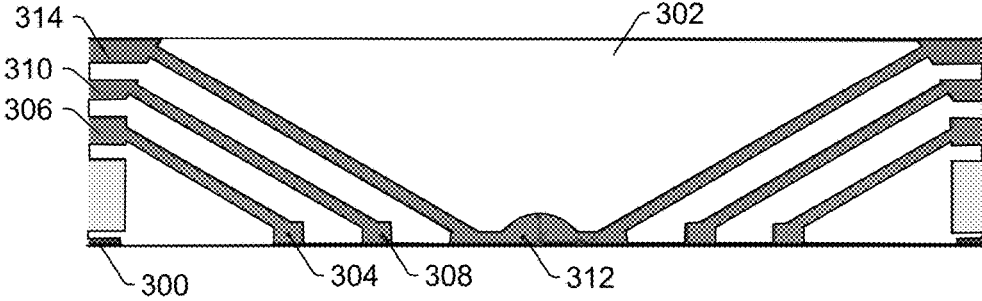

In an additional embodiment, the first gas flow subsystem includes multiple channels for replacing the gas with the first medium, and the first gas flow subsystem is configured to cause the first medium to have different values of a characteristic proximate the two or more of the multiple channels. In one such embodiment, the first medium is a vacuum, and the characteristic is pressure. In this manner, the first gas flow subsystem may be configured for creating multiple stages of vacuum using multiple stages of pumping. FIG. 3 illustrates the result of numerical simulation performed for one embodiment of multiple stage vacuum achievable by the embodiments described herein. This figure shows the capability of the embodiments described herein estimated by simulation. In this figure, the first gas flow subsystem has three stages of pumping. The first one reduces air pressure by 90% from 101 kPa at position 300 at the edge of housing block 302 to −10 kPa at position 304 proximate the inlet of channel 306 of the first gas flow subsystem. The second stage reduces the air pressure from −10 kPa at position 304 to −1.3 kPa at position 308 proximate the inlet of channel 310 of the first gas flow subsystem, and the third by 56% from −1.3 kPa at position 308 to −0.6 kPa at position 312 proximate the inlet of channel 314 of the gas flow subsystem. The third stage may be less efficient than the first two because the air is much already thinner closer to the center due to the first two stages.

The values of the pressure described above are merely non-limiting examples of the levels of vacuum that are possible by the embodiments described herein. The vacuum pressure is adjustable based on use cases (e.g., the amount of air scattering reduction needed, which may vary depending on, for example, wafer haze level). In addition, a "vacuum" as that term is used herein is not intended to necessarily mean a perfect or complete vacuum as can be seen by the vacuum pressure values described above. Instead, a "vacuum" as that term is used herein is generally defined as a medium having a pressure below atmospheric pressure, and any of the vacuum pressures described herein can be selected by a user when configuring the first gas flow subsystem. A "vacuum" as that term is defined herein is created by intentionally drawing one or more gasses out of a volume without intentionally replacing the gas(es) with one or more other gasses. For example, intentionally replacing one or more gasses in a volume with one or more other gasses (the same or different than the original one or more gasses) that happen to (or are designed to) have a pressure in the volume lower than the original one or more gasses would not be considered creating a vacuum in the volume as that term is used herein. The portion of the first gas flow subsystem shown in FIG. 3 may be further configured as described herein and may be coupled to the inspection subsystem (not shown in FIG. 3) as described further herein.

One new, important feature of the embodiments described herein is therefore that they are or can be configured for multiple stages of pumping to draw a vacuum. Although three stages of pumping are shown in FIG. 2 by the three different channels in the housing block and three levels of vacuum are shown in FIG. 3 at different pressures, different stages of pumping and vacuum may be used. For example, the embodiments described herein may be configured for one or more stages of pumping and different levels of vacuum. In some instances, the first gas flow subsystem may be configured with as many vacuum channels as seems practical, and if fewer stages of vacuum are needed, less than all of the vacuum channels may be used. For example, which channels are used to create a vacuum may be controlled by the vacuum pumps attached to each of the channels. In one such case, a first gas flow subsystem configured for three stages of vacuum may also be used for two stages of vacuum by simply not activating the vacuum pump(s) connected to the channels for one of the three stages.

In the vacuum embodiments described herein, the specimen can be held by a vacuum chuck with higher vacuum under it than above so that the specimen is not lifted off of the chuck and into contact with the housing block and/or objective housing by the first medium. For example, chuck 222 shown in FIG. 2 can be a vacuum chuck. The chuck may also be a vacuum chuck or an air/vacuum combination chuck. The system may also be configured to actively control the vacuum pressure of the vacuum chuck depending on the vacuum level on top of the specimen. Chuck 222 may alternatively be an electro-static chuck, including any such chuck suitable for use in vacuum environments. In this manner, the chuck may be configured to hold the specimen by electro-static force. Particle issues associated with electro-static chucks may be tolerable since, as described further herein, air purging can be implemented to enclose the chuck and prevent external particles from getting in. The chuck may be coupled to a scanning subsystem as described further herein, which may be configured to cause the light to be scanned over the specimen in any suitable manner. In addition, the chuck may be an R-θ stage configured for spinning and linear motion.

In another embodiment, the first local volume includes gap 236 between housing block 206 and the specimen. For example, the housing block of the local vacuum subsystem may be positioned substantially close to the specimen without contacting the specimen, e.g., with about a 50 um to 1 mm gap from it. As described further herein, vacuum may be drawn by pumping air out of the gap through one or more pumping channels. Due to such a small gap, a pressure gradient is built up as the air flows from outside to the center of the objective. Vacuum is thereby also formed in volume 214 under the objective.

In some embodiment, the first medium has a refractive index at one or more wavelengths of the light directed to the area and the light from the area that is less than the refractive index of dry air at the one or more wavelengths. As described above, the first gas flow subsystem is configured to replace a gas located proximate to the area on the specimen with a first medium that scatters less of the light than the gas thereby increasing the sensitivity of the system. More specifically, in some embodiments, the first gas flow subsystem is configured to suppress atmospheric Rayleigh light scattering interferences in light scattering based surface inspection systems by replacing normal air present proximate to the area on the specimen with a light propagation medium that has a lower Rayleigh scattering cross-section than normal air.

In this manner, the first medium preferably has a refractive index at the operating wavelength(s) of the inspection subsystem that is lower than the refractive index of dry air at the operating wavelength(s). For example, the inspection subsystem may operate at ultraviolet (UV) wavelengths. Therefore, in one embodiment, the first medium preferably has a refractive index at UV wavelengths that is less than the refractive index of dry air at the UV wavelengths. In one preferred embodiment, the first medium is a gas that has the lowest known Rayleigh cross-section for UV wavelengths (e.g., wavelengths down to about 200 nm).

In one embodiment, the first medium consists essentially of helium (He). For example, the purpose of the vacuum in the embodiments described herein is to effectively reduce the non-abnormality light scattering that would otherwise be detected by the system in the presence of clean dry air. Therefore, other media may be used in place of the vacuum if they can reduce light scattering to the same degree as vacuum (or substantially the same degree depending on the application, if the expense of the vacuum implementation is unacceptable, if the vacuum implementation is impractical, etc.). In one such acceptable alternative, the vacuum can be replaced with helium purging. Helium is effective in reducing air scattering just like vacuum. In particular, helium molecules are smaller than air molecules, and so helium will scatter less light than air in the same manner as vacuum. The first gas flow subsystem may be configured to channel helium directly to under the objective. Helium pressure can push air out through the gap between the housing block and the specimen. One advantage of the helium purging is the low pressure required to make the flow smoother. In addition, using helium instead of vacuum for reducing light scattering due to air may be preferred because it is easier to implement.

As an alternative to elemental helium, the first medium may consist essentially of neon (Ne). As used herein, the term "consists essentially of" refers to a medium that includes one of the gases described above possibly in combination with other gases present in amounts that do not materially affect the basic characteristics of the light scattering caused by the first medium. For instance, a first medium that consists essentially of elemental helium or neon may include negligible amounts of dry air that do not materially affect the basic characteristics of the light scattering caused by the medium. Additional information on how helium and neon can reduce light scattering in inspection systems thereby increasing the sensitivity of the systems is described in U.S. Pat. No. 7,372,559 to Haller et al. issued May 13, 2008, which is incorporated by reference as if fully set forth herein. The embodiments described herein may be further configured as described in this patent.

Figure 4:
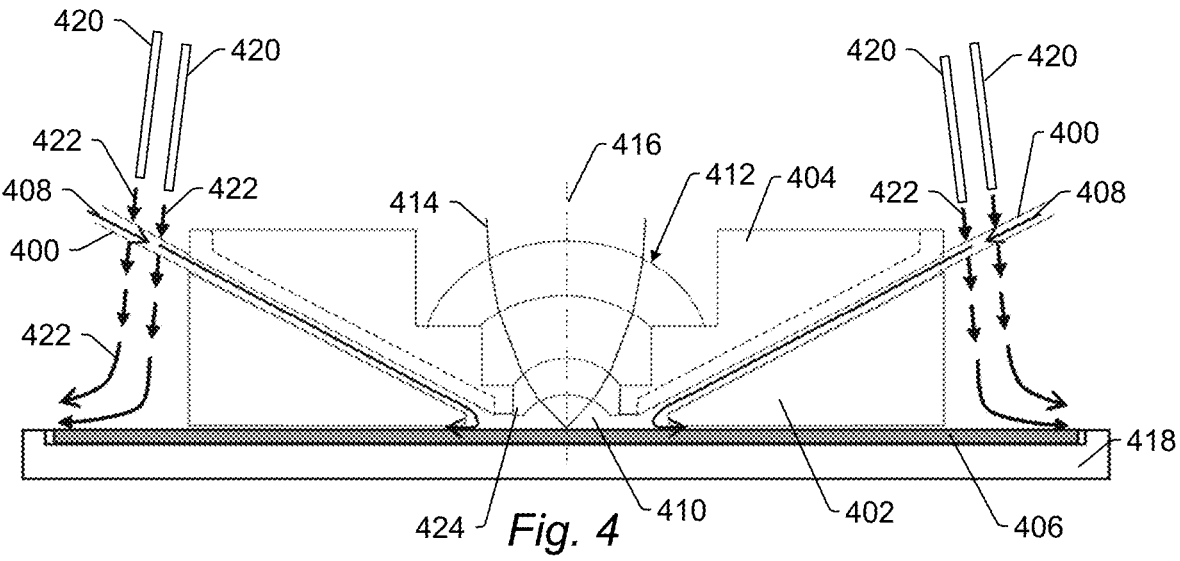

FIG. 4 illustrates one embodiment of helium purging. In particular, the first gas flow subsystem may include channels 400 formed in housing block 402. Housing block 402 may be coupled to objective housing 404 as described further herein, so that the two housings are adjacent and abutting as shown by the dashed lines between the housings in FIG. 4. In this manner, the helium channels can be machined in a separate assembly attached to the objective assembly. However, housing block 402 and objective housing 404 may be formed from a single piece of material and may therefore be a single element in the system. Housing block 402 and objective housing 404 may be further configured as described herein. Although one particular number of helium flow channels are shown in FIG. 4, the first gas flow subsystem may include any suitable number of channels in any suitable configuration described herein.

Instead of drawing air away from specimen 406 as in the embodiment shown in FIG. 2, channels 400 are configured so that helium 408 displaces any air or gas in volume 410 between objective 412 and the specimen thereby forming a reduced scattering medium in the volume. For example, each of the channels may be coupled to a helium source (not shown) and one or more other elements that push helium through the channels in this manner. The helium source and any other elements (not shown) included in such a first gas flow subsystem may include any suitable source and elements known in the art and may be selected based on information about the volume between the specimen and the objective, the required or desired level of helium pressure, the configuration of the channels, etc. The first gas flow subsystem may include any other suitable elements (not shown) normally included in gas flow subsystems such as valves, exhaust elements, controllers, etc.

Objective 412 may be further configured as described herein, and the optical element of objective 412 shown in FIG. 4 may be only one of several optical elements of the objective as shown in FIG. 1. Alternatively, objective 412 may include only the one optical element shown in FIG. 4. As described further herein, light 414 scattered from the specimen may be collected by the objective and directed to one or more other elements (not shown in FIG. 4) of the inspection subsystem. Vertical line 416 indicates the optical axis of the collection/detection subsystem of the inspection subsystem. This embodiment may also include chuck 418, which may be configured according to any of the embodiments described herein.

The system also includes a second gas flow subsystem configured for replacing the gas in a second local volume proximate the first local volume with a second medium different than the first medium. For example, as shown in FIG. 2, the second gas flow subsystem shown schematically by channels 224 may direct second medium 226 to a second local volume proximate the first local volume to thereby replace any gas in that second local volume with the second medium. In another example, as shown in FIG. 4, the second gas flow subsystem shown schematically by channels 420 may direct second medium 422 to a second local volume proximate the first local volume to thereby replace any gas in that second local volume with the second medium. As shown in these figures, the second gas flow subsystem is configured so that the second medium is near and showers around the objective lens and objective lens housing. The objective and specimen may be placed in a closed scanning chamber (not shown). The second medium may be brought into the chamber from above with exhaust (not shown) from below. In some cases, the second medium may create a positive pressure, e.g., about 10 Pascals to about 100 Pascals of pressure above ambient, in the chamber outside of the first local volume. Therefore, one new, important feature of the embodiments described herein is that they are configured to purge the objective/specimen from outside while creating a reduced scattering medium (e.g., a local vacuum) inside between the specimen and the objective. In this manner, the embodiments described herein can use a purging medium outside of a different medium (e.g., a local vacuum) to keep the specimen clean while also reducing scattering. The inventors are unaware of any other architecture that can keep the specimen clean while also creating a vacuum.

In one embodiment, the second medium consists essentially of clean dry air (CDA). In this manner, the embodiments described herein may be configured for air purging with local vacuum. Alternatively, the embodiments described herein may be configured for air purging with helium purging. In either case then, the system may use first and second media that are different from each other. In particular, although helium may be used for the first and second media, it is not needed for the second medium and would unnecessarily increase the cost of the system compared to using CDA for the second medium. Therefore, the preferred combinations of media for the embodiments described herein are either vacuum or helium, used in combination with CDA.

In another embodiment, the second gas flow subsystem is configured to not direct the second medium into a path of the light directed to the area and a path of the light from the area. In some embodiments, the second gas flow subsystem is configured for moving foreign material away from the specimen with the second medium. For example, the purpose of the second gas flow subsystem and the second medium has nothing to do with the imaging performance of the inspection subsystem. In particular, unlike the first gas flow subsystem and first medium that are intended to improve the sensitivity of the inspection subsystem by reducing light scattering from non-abnormality sources, the second gas flow subsystem and second medium are primarily (and possibly only) used to keep the specimen clean. In other words, the second gas flow subsystem and second medium are preferably configured to reduce any fall on particles or other foreign materials that may otherwise be deposited on the specimen during the inspection process. This foreign material may be from any possible source such as foreign material in the clean room, foreign material from the inspection subsystem, etc. The second gas flow subsystem and second medium may be configured to have gas flow characteristics, e.g., gas flow rate, gas pressure, etc., that facilitate the movement of foreign material away from the specimen and into an exhaust subsystem (not shown) that is included in or coupled to the second gas flow subsystem. Therefore, there is no reason to configure the second gas flow subsystem so that it directs the second medium into the path of any of the light directed to the specimen and/or returned from the specimen. In addition, when the second medium is a medium like CDA, directing the medium into the path of the light in the inspection subsystem may actually be deleterious to the performance of the system.

The first gas flow subsystem may also be configured in such a manner that the second medium is effectively prevented from being located in the first local volume surrounding the illuminated area on the specimen. For example, if the first medium is a vacuum, then if any of the second medium enters the first local volume, that second medium will also be removed by the first gas flow subsystem when creating and/or maintaining the vacuum. If the first medium consists essentially of helium, then the first gas flow subsystem may be configured so that the helium characteristics, e.g., flow rate, pressure, etc., are such that the helium effectively pushes the second medium out of the first local volume. In this manner, the embodiments described herein may be easily configured so that the second medium does not hinder the performance of the inspection subsystem.

In a further embodiment, the first and second gas flow subsystems do not alter the gas outside of the second local volume. For example, aside from creating, controlling, maintaining, etc. the first and second media in the first and second local volumes, respectively, the first and second gas flow subsystems are not configured for altering the gas, ambient or otherwise, in other parts of the tool. One reason for this is the designed purpose of the gas flow subsystems, i.e., they are configured for creating, controlling, maintaining, etc. the first and second media in relatively specific, local volumes within the inspection subsystem. Any areas within or surrounding the rest of the inspection subsystem, e.g., areas outside of the second local volume and perhaps within a housing of the inspection subsystem, are not substantially affected by the first and second gas flow subsystems. Those areas outside of the second local volume may be allowed to remain at the ambient conditions in which the overall inspection subsystem is located. These configurations are possible because the first and second gas flow subsystems are intended to replace the gas in such relatively small local volumes and for specific reasons. Therefore, the first and second gas flow subsystems can be much less expensive than other systems configured for controlling the whole environment in which the entirety of the inspection subsystem and specimen are located.

In an additional embodiment, an entirety of the inspection subsystem is not located with a vacuum. For example, one new, important feature of the embodiments described herein is that they are configured for creating a vacuum in only a local volume of the inspection tool, i.e., only in a relatively small volume between the objective and the specimen. Because the vacuum is created in such a small volume, an entirety of the specimen and the inspection subsystem do not have to be located within the vacuum. This overcomes many of the disadvantages of currently used inspection systems such as reduced throughput, e.g., the embodiments described herein do not need time to create a vacuum after a specimen is moved into the inspection tool, higher cost, e.g., the embodiments described herein do not need a vacuum housing that is large enough to enclose all of the optical hardware of the tool in addition to the specimen and allow room for the specimen to move within the housing, etc. For example, the embodiments described herein are configured for creating a vacuum that is sufficient to reduce air scattering detected by the inspection subsystem and therefore enable higher sensitivity of the inspection subsystem while still keeping a distance between the objective and the specimen that allows the specimen to move and/or spin.

In an embodiment, the first and second gas flow subsystems are configured for simultaneously replacing the gas in the first and second local volumes, respectively. For example, it may be possible to turn off one of the gas flow subsystems so that they can be used separately if such a configuration is desired. As described further above, both gas flow subsystems can be used at the same time with no physical barrier between the different media and with the first and second local volumes directly adjacent to each other since (1) the first gas flow subsystem can be configured to keep the second medium out of the first local area and (2) if the first medium consists essentially of helium, the performance of the second gas flow subsystem and second medium will not be hampered if some of the helium migrates into the second local area. In this manner, the embodiments described herein can use different media and different gas flow subsystems to achieve superior performance while minimizing cost by tailoring the media and gas flow subsystems for specific functions in specific volumes of the inspection subsystem.

In another embodiment, the first and second gas flow subsystems are configured for controlling the first and second mediums, respectively, during the directing and the generating. For example, at the beginning of an inspection process performed on a specimen, the first and second gas flow subsystems may replace the gas in the first and second local volumes, respectively. Generally, in the embodiments described herein, the characteristics of the first and second media in the first and second local volumes should not vary substantially during the inspection process. So the parameters of the first and second gas flow subsystems may be set at the beginning of the process and then not adjusted again until the inspection is finished.

However, the first and second gas flow subsystems may include any sensors or other equipment for monitoring one or more characteristics of the first and second media in the first and second local volumes, respectively, during an inspection process. A control subsystem (not shown) of the first and/or second gas flow subsystems and/or the system may then alter one or more parameters of the first and/or second gas flow subsystems based on any output responsive to the monitored one or more characteristics. In this manner, the first and second gas flow subsystems may be configured to have different values of at least one parameter of the gas flow subsystems, e.g., flow rate, during an inspection process. In one such example, if a thickness of the specimen varies substantially across the specimen, the distance between the objective and the specimen may change as the inspection subsystem scans across the specimen. In such cases, it may be desirable to alter a setting of one or more vacuum pumps of the first gas flow subsystem during the scan so that the vacuum pressure in the first local volume is substantially the same during the entire scan of the specimen despite the changes in the specimen thickness.

In one embodiment, the system includes a chuck configured for supporting the specimen during the directing and the generating, the chuck includes a recess in which the specimen is disposed during the directing and the generating, and the recess is configured so that an upper surface of the specimen is flush with an upper surface of the chuck outside of the recess while disposed in the recess. For example, as shown in FIG. 2, specimen 212 may be disposed on chuck 222 during inspection, and the chuck has recess 228 in which the specimen is disposed so that upper surface 230 of the specimen is substantially flush with upper surface 232 of the chuck outside of the recess. In this manner, the diameter of the chuck is larger than that of the specimen. The recess in the middle seats the specimen. The depth of the recess is made close to the thickness of regular specimens, e.g., wafers, so that the top surface of the specimen is flush with the chuck. Different types of specimens may vary some in thickness, but such variations will be small relative to the gap between the housing block and the specimen and relative to the distance between the objective and the specimen. The performance of vacuum can be maintained. The flush design enables vacuum to be maintained even when scanning at the edge of a specimen.

Figure 5:
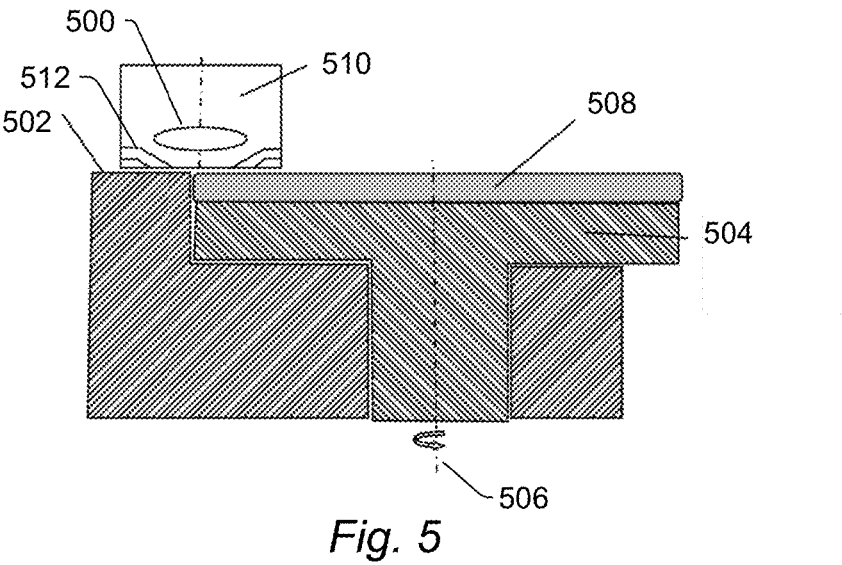

FIG. 5 illustrates further detail of the chuck configuration possibilities for the embodiments described herein. As described above, the chuck may extend beyond the specimen, and an upper surface of the portion of the chuck beyond the specimen is preferably flush with an upper surface of the specimen. In particular, to maintain the vacuum when objective 500 moves close to the edge of a specimen, extension wing 502 may be included in the chuck assembly from the mount of chuck and spindle element 504, which may rotate about axis 506. The top surface of wing 502 is preferably flush with that of specimen 508 as shown in FIG. 5. In this way, the relatively small gap between the housing block and the specimen and/or the housing block and the top surface of the wing can be maintained across the entire diameter (and area) of the specimen.

Being able to maintain such a small gap between the housing block and the specimen and/or the chuck across the entirety of the specimen facilitates creating and maintaining a vacuum between the objective and the specimen as described further herein without having to position the entire inspection subsystem and specimen in a vacuum. In particular, the extension wing can help to maintain the vacuum seal between the specimen and the objective even when scanning is performed proximate the edge of the specimen. As such, the vacuum can be maintained during the entire inspection process performed on the specimen, even if that inspection process scans the edge of the specimen, close to the specimen edge, or even beyond the specimen edge. Different types of specimens may vary some in thickness, but that variation should be small compared to the height of the gap, e.g., about 0.5 mm. In this manner, different parts of the chuck assembly may be fixedly attached to each other without a need for adjustment as described further herein.

Although FIG. 5 shows objective 500 in a simplified version of housing 510 that collectively includes the objective housing and vacuum channels 512 formed therein, the housing is shown in such a manner only so that it can be shown relative to the enhanced detail of the chuck assembly. The inspection subsystem and the first and second gas flow subsystems included in a system embodiment with the chuck assembly shown in FIG. 5 may be further configured as described herein. In addition, the extension wing included in the chuck assembly may surround the entire specimen and is shown on only one side of the specimen in FIG. 5 for simplicity. Furthermore, although the chuck and spindle are shown in FIG. 5 as a single element, the chuck and the spindle may be separate elements that are coupled in any suitable manner known in the art. The chuck assembly shown in FIG. 5 may be further configured as described herein and may be part of a scanning subsystem configured as described herein.

The chuck may also include two different parts (not shown) that may be adjustable in height relative to each other so that the top surface of specimens having different thicknesses are flush with the top surface of the part not under the specimen. The system may be configured to control the different parts of the chuck based on a priori information about a specimen such as an expected specimen thickness or a thickness of the specimen as measured by another tool. The system may also be configured to control the different parts of the chuck based on some visual feedback generated by the system itself with respect to the position of the upper surface of the specimen relative to the upper surface of the chuck outside of the specimen. For example, during alignment of the specimen to the inspection tool or a phase of the process performed prior to the inspection scan, the system may illuminate the area of the specimen proximate the edge of the specimen and beyond the edge of the specimen and detect the light reflected from that area. The reflected light image may be used to determine if the upper surfaces of the specimen and the chuck outside of the specimen are flush and/or if adjustments should be made to the depth of the recess so that the two surfaces can be made flush. Such a function may be similar to an auto-focusing function performed to bring a specimen into focus before a scan, but in this case instead of the chuck moving as a single unit, at least one part of the chuck will be moved relative to another, and the height of the upper surface of the specimen is being positioned relative to the height of the upper surface of the chuck outside of the specimen rather than the optical hardware.

Some embodiments of the system include an air bearing positioned outside of the first local volume and configured for preventing the first and second gas flow subsystems from contacting the specimen. For example, an air bearing may be used at the outer ring of the housing block as a safety guard and also possibly to reduce the air gap. In this manner, the air bearing may prevent the vacuum housing block from coming in contact with the specimen. The outlet of the air bearing can be an array of relatively small holes that are located outside the outermost vacuum stage. The air bearing may include any suitable commercially available vacuum preload air bearing known in the art. The air bearing is optional but can provide significant benefits for the embodiments described herein. For example, without the air bearing, a relatively large gap, e.g., hundreds of microns, may be needed between the housing block and the specimen to prevent the housing block from crashing into the specimen. With an air bearing, that gap can be reduced to tens of microns.

Figure 6:
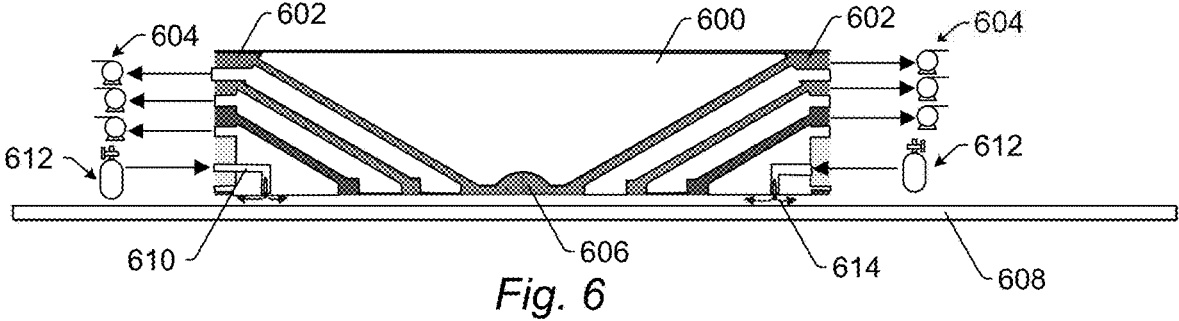

FIG. 6 shows one possible implementation that includes an air bearing. Like other embodiments described herein, the first gas flow subsystem may include housing block 600.

Multiple channels 602 are formed in the housing block and connected to vacuum pumps 604 so that in combination they can pull air out of first local volume 606 between the housing block (and an objective lens (not shown in FIG. 6) positioned therein) and specimen 608. The air bearing may include channels 610 formed in the housing block and positioned outside of any of the channels included in the first gas flow subsystem (e.g., outside of any vacuum channels or helium purging channels). The channels may be coupled to pressurized air source 612 and any other suitable gas flow elements (not shown) such as those described further herein.

The air bearing may be configured to direct pressurized air from the source through the channels and out of outlets of the channels formed in the housing block. In this manner, pressurized air 614 may be forced into the gap between the outside edge of the housing block and the specimen, which should reduce the possibility of the housing block coming into contact with the specimen for any reason such as the vacuum created by the first gas flow medium.

This pressurized air is preferably different from any CDA used by the second gas flow subsystem. For example, the pressurized air of the air bearing is used for maintaining a suitable gap between the housing block and the specimen, particularly near the edges of the housing block, while the CDA used as the second medium is used for reducing foreign contamination on the specimen. As such, the pressurized air and the CDA may have different characteristics, like pressure, air flow directions, compositions, etc.

In some embodiments, the first gas flow subsystem includes a housing block through which the gas is replaced with the first medium, and the inspection subsystem is configured for directing the light to the area through one or more passages formed through the housing block. For example, the housing block and any of the first and second gas flow subsystems formed therein and/or coupled thereto (including any pump outlets, gas flow channels, channel inlets, etc.) may be configured so that the light can be directed to the specimen and collected from the specimen in whatever configuration is selected. In one such example, the pump outlets of the channels formed in the housing block for the first gas flow subsystem may be solid in some azimuth area to allow holes to be drilled for illumination to pass through and the reflected beam to get out. In the embodiment shown in FIG. 1, for example, the light from light source 100 is shown being directed to specimen through housing block 108, which may include a passage (not shown) configured for allowing the light to pass therethrough. The passage may be an open channel with a window proximate the specimen end of the channel so that the channel does not affect the first medium formed in the first local volume. Other than being sealed in some way at the specimen end of the passage, the passage may be formed in the housing block in any of the same manners described herein with respect to the channels of the first gas flow subsystem.

In another embodiment, the system includes a window element positioned between an objective of the inspection subsystem and the specimen and configured for transmitting the light from the area without alteration of the light. For example, independent of the lens housing, a hemispherical dome window may be used with stronger glass such as sapphire. Examples of such a window element are shown by hemispherical dome windows 234 and 424 in FIGS. 2 and 4, respectively. As shown in these figures, the hemispherical dome window is positioned between the objective lens and the specimen so the first medium will replace any gas inside the dome window and between the dome window and the specimen. A benefit of using an additional dome window is to reduce any stress on the optical elements by using a stronger glass. The additional dome window may have two conformal and concentrical surfaces with center of curvature being at the specimen surface to minimize optical aberrations.

The computer subsystem may be configured for generating results for the specimen, which may include any of the information described herein such as any defect and/or particle information, a map of defect and/or particle information across the specimen, etc. The results for the abnormalities may include, but are not limited to, locations of the abnormalities, detection scores, information about the defect and/or particle classifications such as class labels or IDs, etc., or any such suitable information known in the art. The results for the specimen may be generated by the computer subsystem in any suitable manner.

All of the embodiments described herein may be configured for storing results of one or more steps of the embodiments in a computer-readable storage medium. The results may include any of the results described herein and may be stored in any manner known in the art. The results for the specimen may have any suitable form or format such as a standard file type. The storage medium may include any storage medium described herein or any other suitable storage medium known in the art. After the results have been stored, the results can be accessed in the storage medium and used by any of the method or system embodiments described herein, formatted for display to a user, used by another software module, method, or system, etc. to perform one or more functions for the specimen or another specimen of the same type.

Such functions include, but are not limited to, altering a process such as a fabrication process or step that was or will be performed on the specimen in a feedback or feedforward manner, etc. For example, the computer subsystem may be configured to determine one or more changes to a process that was performed on the specimen and/or a process that will be performed on the specimen based on the abnormalities. The changes to the process may include any suitable changes to one or more parameters of the process. The computer subsystem preferably determines those changes such that the abnormalities can be reduced or prevented on other specimens on which the revised process is performed, the abnormalities can be corrected or eliminated on the specimen in another process performed on the specimen, the abnormalities can be compensated for in another process performed on the specimen, etc. The computer subsystem may determine such changes in any suitable manner known in the art.

Those changes can then be sent to a semiconductor fabrication system (not shown) or a storage medium (not shown) accessible to both the computer subsystem and the semiconductor fabrication system. The semiconductor fabrication system may or may not be part of the system embodiments described herein. For example, the inspection subsystem and/or the computer subsystem described herein may be coupled to the semiconductor fabrication system, e.g., via one or more common elements such as a housing, a power supply, a specimen handling device or mechanism, etc. The semiconductor fabrication system may include any semiconductor fabrication system known in the art such as a lithography tool, an etch tool, a chemical-mechanical polishing (CMP) tool, a deposition tool, and the like.

Each of the embodiments described herein may be combined together into a single embodiment unless otherwise noted herein. The embodiments described herein may also be configured as described in U.S. Pat. No. 6,813,026 to McAninch issued Nov. 2, 2004, U.S. Pat. No. 7,359,052 to Fielden et al. issued Apr. 15, 2008, U.S. Pat. No. 7,420,681 to Wang et al. issued Sep. 2, 2008, U.S. Pat. No. 7,564,552 to Fielden et al. issued Jul. 21, 2009, U.S. Pat. No. 7,623,239 to Fielden et al. issued Nov. 4, 2009, U.S. Pat. No. 7,755,764 to Kwak et al. issued Jul. 13, 2010, U.S. Pat. No. 7,764,376 to Fielden et al. issued Jul. 27, 2010, and U.S. Pat. No. 11,315,816 to Pressburger et al. issued Apr. 26, 2022, all of which are incorporated by reference as if fully set forth herein.

Another embodiment relates to a method for inspecting a specimen. The method includes directing light to an area on a specimen and generating output responsive to light from the specimen, which may be performed by an inspection subsystem such as that shown in FIG. 1. The method also includes replacing a gas in a first local volume surrounding the area on the specimen with a first medium during the directing and the generating, which may be performed by a first gas flow subsystem such as those shown in FIGS. 2 and 4. The first medium scatters less of the light than the gas. In addition, the method includes replacing the gas in a second local volume located proximate to the first local volume with a second medium during the directing and the generating, which may be performed by a second gas flow subsystem such as those shown in FIGS. 2 and 4. The second medium is different than the first medium. The method further includes detecting abnormalities on the specimen based on the output. The detecting is performed by a computer system, e.g., computer subsystem 122 shown in FIG. 1.

Each of the steps of the method may be performed as described further herein. The method may also include any other step(s) that can be performed by the system(s) described herein. The steps of the method may be performed by the systems described herein, which may be configured according to any of the embodiments described herein.

Figure 7:
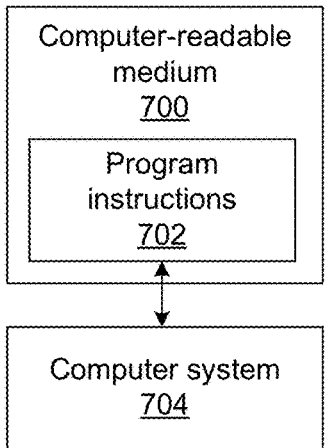
FIG. 7 is a block diagram illustrating one embodiment of a non-transitory computer-readable medium storing program instructions executable on a computer system for performing one or more of the computer-implemented methods described herein.

An additional embodiment relates to a non-transitory computer-readable medium storing program instructions executable on a computer system for performing a computer-implemented method for inspecting a specimen. One such embodiment is shown in FIG. 7. In particular, as shown in FIG. 7, non-transitory computer-readable medium 700 includes program instructions 702 executable on computer system 704. The computer-implemented method may include any step(s) of any method(s) described herein.

Program instructions 702 implementing methods such as those described herein may be stored on computer-readable medium 700. The computer-readable medium may be a storage medium such as a magnetic or optical disk, a magnetic tape, or any other suitable non-transitory computer-readable medium known in the art.

The program instructions may be implemented in any of various ways, including procedure-based techniques, component-based techniques, and/or object-oriented techniques, among others. For example, the program instructions may be implemented using ActiveX controls, C++ objects, JavaBeans, Microsoft Foundation Classes ("MFC"), SSE (Streaming SIMD Extension) or other technologies or methodologies, as desired.

Computer system 704 may be configured according to any of the embodiments described herein.

Further modifications and alternative embodiments of various aspects of the invention will be apparent to those skilled in the art in view of this description. For example, methods and systems for inspecting a specimen are provided. Accordingly, this description is to be construed as illustrative only and is for the purpose of teaching those skilled in the art the general manner of carrying out the invention. It is to be understood that the forms of the invention shown and described herein are to be taken as the presently preferred embodiments. Elements and materials may be substituted for those illustrated and described herein, parts and processes may be reversed, and certain features of the invention may be utilized independently, all as would be apparent to one skilled in the art after having the benefit of this description of the invention. Changes may be made in the elements described herein without departing from the spirit and scope of the invention as described in the following claims.

The invention claimed is:

1. A system configured for inspecting a specimen, comprising:
   an inspection subsystem configured for directing light to an area on the specimen and for generating output responsive to light from the area on the specimen, wherein all optical hardware of the inspection subsystem is not located within a vacuum;
   a first gas flow subsystem configured for replacing a gas in a first local volume surrounding the area on the specimen with a first medium that scatters less of the light than the gas, wherein the first medium is the vacuum;
   a second gas flow subsystem configured for replacing the gas in a second local volume proximate the first local volume with a second medium different than the first medium; and
   a computer subsystem configured for detecting abnormalities on the specimen based on the output.

2. The system of claim 1, wherein the first gas flow subsystem comprises multiple channels for replacing the gas with the first medium, and wherein the first gas flow subsystem is further configured to cause the first medium to have different values of a characteristic proximate two or more of the multiple channels.

3. The system of claim 2, wherein the characteristic is pressure.

4. The system of claim 1, wherein the first medium has a refractive index at one or more wavelengths of the light directed to the area and the light from the area that is less than the refractive index of dry air at the one or more wavelengths.

5. The system of claim 1, wherein a height of the first local volume is defined by a distance between an objective of the inspection subsystem and the specimen.

6. The system of claim 1, wherein the second medium consists essentially of clean dry air.

7. The system of claim 1, wherein the second gas flow subsystem is further configured to not direct the second medium into a path of the light directed to the area and a path of the light from the area.

8. The system of claim 1, wherein the second gas flow subsystem is further configured for moving foreign material away from the specimen with the second medium.

9. The system of claim 1, wherein the first and second gas flow subsystems do not alter the gas outside of the second local volume.

10. The system of claim 1, wherein an entirety of the inspection subsystem is not located within the vacuum.

11. The system of claim 1, wherein the first and second gas flow subsystems are further configured for simultaneously replacing the gas in the first and second local volumes, respectively.

12. The system of claim 1, wherein the first and second gas flow subsystems are further configured for controlling the first and second mediums, respectively, during the directing and the generating.

13. The system of claim 1, further comprising a chuck configured for supporting the specimen during the directing and the generating, wherein the chuck comprises a recess in which the specimen is disposed during the directing and the generating, and wherein the recess is configured so that an upper surface of the specimen is flush with an upper surface of the chuck outside of the recess while disposed in the recess.

14. The system of claim 1, further comprising an air bearing positioned outside of the first local volume and configured for preventing the first and second gas flow subsystems from contacting the specimen.

15. The system of claim 1, wherein the first gas flow subsystem comprises a housing block through which the gas is replaced with the first medium, and wherein the inspection subsystem is further configured for directing the light to the area through one or more passages formed through the housing block.

16. The system of claim 1, further comprising a window element positioned between an objective of the inspection subsystem and the specimen and configured for transmitting the light to the area and from the area without alteration of the light.

17. A non-transitory computer-readable medium, storing program instructions executable on a computer system for performing a computer-implemented method for inspecting a specimen, wherein the computer-implemented method comprises:
   directing light to an area on a specimen and generating output responsive to light from the area on the specimen with an inspection subsystem, wherein all optical hardware of the inspection subsystem is not located within a vacuum;
   replacing a gas in a first local volume surrounding the area on the specimen with a first medium during said directing and said generating, wherein the first medium scatters less of the light than the gas, and wherein the first medium is the vacuum;
   replacing the gas in a second local volume located proximate to the first local volume with a second medium during said directing and said generating, wherein the second medium is different than the first medium; and
   detecting abnormalities on the specimen based on the output.

18. A method for inspecting a specimen, comprising:
   directing light to an area on a specimen and generating output responsive to light from the area on the specimen with an inspection subsystem, wherein all optical hardware of the inspection subsystem is not located within a vacuum;
   replacing a gas in a first local volume surrounding the area on the specimen with a first medium during said directing and said generating, wherein the first medium scatters less of the light than the gas, and wherein the first medium is the vacuum;
   replacing the gas in a second local volume located proximate to the first local volume with a second medium during said directing and said generating, wherein the second medium is different than the first medium; and
   detecting abnormalities on the specimen based on the output, wherein said detecting is performed by a computer system.

* * * * *